United States Patent [19]

Zuber

[11] 4,169,807

[45] Oct. 2, 1979

[54] NOVEL SOLVENT DRYING AGENT

[75] Inventor: John R. Zuber, Piscataway, N.J.

[73] Assignee: RCA Corporation, New York, N.Y.

[21] Appl. No.: 888,425

[22] Filed: Mar. 20, 1978

[51] Int. Cl.$^2$ .............................................. C23G 5/02
[52] U.S. Cl. ................................... 252/171; 252/172; 252/162; 252/364; 252/DIG. 9; 134/30; 134/31; 134/37; 134/38; 260/698
[58] Field of Search ............... 252/172, 171, 162, 364, 252/DIG. 9, 67; 134/30, 31, 37, 38; 260/698 F; 62/114

[56] References Cited

U.S. PATENT DOCUMENTS

| | | | |
|---|---|---|---|
| 3,400,077 | 9/1968 | Orfeo et al. | 252/171 |
| 3,490,739 | 1/1970 | Buckman et al. | 252/171 X |
| 3,530,073 | 9/1970 | Clark et al. | 252/170 |
| 3,554,918 | 1/1971 | Schofield et al. | 252/171 |
| 3,640,884 | 2/1972 | Schofield et al. | 252/171 |
| 3,671,442 | 6/1972 | Schofield | 252/171 |
| 3,671,443 | 6/1972 | Schofield | 252/171 |
| 3,671,444 | 6/1972 | Schofield | 252/171 |
| 3,671,446 | 6/1972 | Schofield et al. | 252/171 |
| 3,692,686 | 9/1972 | Barton et al. | 252/171 |
| 3,694,368 | 9/1972 | Barton et al. | 252/171 |
| 3,728,268 | 4/1973 | Burt | 252/171 X |
| 3,729,424 | 4/1973 | Schofield et al. | 252/171 |
| 3,785,987 | 1/1974 | Schofield et al. | 252/171 |
| 3,789,004 | 1/1974 | McMillan et al. | 252/171 |
| 3,794,524 | 2/1974 | Nogueira et al. | 252/DIG. 9 |
| 3,794,590 | 2/1974 | Barton et al. | 252/DIG. 9 |
| 3,836,474 | 9/1974 | Barton et al. | 252/171 |
| 4,023,984 | 5/1977 | Clementson | 252/DIG. 9 |
| 4,086,179 | 4/1978 | Schneider | 134/31 X |

Primary Examiner—Mayer Weinblatt
Attorney, Agent, or Firm—Birgit E. Morris; Howard F. VanDenburgh

[57] ABSTRACT

Mixtures of 1-propanol, water and certain perfluoro compounds form excellent drying agents for silicon based devices. The mixtures have good wetting properties and form azeotropic mixtures in the vapor phase.

4 Claims, No Drawings

NOVEL SOLVENT DRYING AGENT

This invention relates to a new solvent drying agent. More particularly, this invention relates to an azeotropic mixture of certain fluorocarbons, 1-propanol and water.

BACKGROUND OF THE INVENTION

Several of the steps in the preparation of silicon devices for the semiconductor industry require contacting a silicon wafer with various solutions such as photoresist solvent, etching solutions and the like. These solutions must be completely removed to reduce the danger of contamination of the wafers. Distilled water rinsing is generally used, followed by a drying step. The usual drying step includes rinsing the wet device with volatile organic solvents or solvent mixtures, which displace the water and evaporate.

Several organic solvent mixtures are known and are readily available. For example, azeotropic mixtures of trichlorotrifluoroethane with solvents such as methylene chloride, methanol, ethanol, acetonitrile, acetone, hexafluoroacetone and hydrogen fluoride are disclosed in U.S. Pat. Nos. 3,400,077, 3,490,739, 3,728,268 and 3,789,004. Various azeotropic mixtures of tetrachlorodifluoroethane with water, ethanol, isopropanol, the butanols, tertiary amyl alcohol, 1,2-dichloroethane, trichloroethylene, nitromethane, acetic acid, propionic acid, dioxane, isopropylacetate, monomethyl ether of ethylene glycol and the like are disclosed in U.S. Pat. Nos. 3,530,073, 3,554,918, 3,640,884, 3,671,442, 3,671,443, 3,671,444, 3,671,446, 3,692,686, 3,694,368, 3,729,424, 3,785,987, 3,794,590 and 3,836,474. However, the presence of chlorine in these polyfluorinated compounds results in the formation of hydrochloric acid in aqueous solution which adversely affects silicon devices. Further, since the above chlorofluoro compounds are not good wetting agents, a surfactant is usually added, which also increases the danger of contamination of the silicon wafer.

Volatile solvents such as acetone can also be employed as drying agents, but acetone has a very low flash point (15° F. or −9° C.) and thus it constitutes a fire hazard and can not be used in commercial operation.

Aqueous isopropanol mixtures are excellent wetting agents, and do not contaminate silicon surfaces, but since they are not volatile, devices must be blown dry to remove the last of the liquid, adding an additional step and expense to manufacture.

It would be highly desirable to obtain a volatile, non-flammable, azeotropic mixture which does not contain chlorine, and which can dry silicon devices without contaminating them.

SUMMARY OF THE INVENTION

It has been found that mixtures of certain perfluorinated cyclic compounds, 1-propanol and water form azeotropic mixtures in the vapor phase, regardless of the concentration of water in the liquid phase, and thus are excellent drying agents even after a considerable amount of water has been absorbed by the liquid. Azeotropic mixtures included herein contain 1-propanol and water and either perfluoro-2-butyltetrahydrofuran or perfluoro-1,4-dimethylcyclohexane.

DETAILED DESCRIPTION OF THE INVENTION

Perfluoro-2-butyltetrahydrofuran and perfluoro-1,4-dimethylcyclohexane are commercially available liquid fluorocarbon compounds which have good wetting properties and are volatile but non-flammable; are stable and inert as well as non-toxic.

Perfluoro-2-butyltetrahydrofuran has the formula

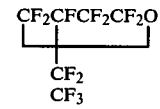

a boiling point of 50° C. and a refractive index of 1.267.

Perfluoro-1,4-dimethylcyclohexane has the formula

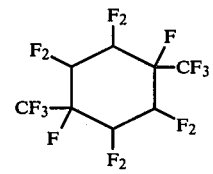

a boiling point of 97° C., and a refractive index of 1.280.

In addition, solutions of the above perfluorocarbons, 1-propanol and water have a boiling point lower than any of the boiling points of the components, indicating the presence of an azeotropic mixture. The vapor phase has a constant ratio of 80 percent of perfluoro-1,4-dimethylcyclohexane and 20 percent of a 72:28 percent by weight mixture of 1-propanol and water. Increases in water content in the liquid phase does not change the component ratio in the vapor phase, again indicating that a true ternary mixture is formed in the vapor phase.

In cleaning silicon devices, after a water rinse step the devices are immersed in the ternary liquid mixture of fluorocarbon, 1-propanol and water and then removed. The ternary mixture displaces water on the surface of the device and then quickly evaporates when the device is removed. Since the devices are contacted both with the alcohol-water liquid and the fluorocarbon vapor, other polar and non-polar impurities may be removed from the silicon devices as well, providing for both drying and cleaning. Another advantage of the present mixtures is that they have excellent wetting properties and no surface active agent is required to be added. The present solutions completely displace water on the surface of silicon devices.

The invention will be further illustrated by the following Examples but the invention is not meant to be limited to the details described therein. In the Examples parts are by weight.

EXAMPLE 1

The boiling points of various mixtures of perfluoro-1,4-dimethylcyclohexane (PDMC), 1-propanol and water are presented below.

| Components | Boiling Point °C. |
| --- | --- |
| PDMC | 97 |
| 1-propanol-water azeotrope | 88 |
| PDMC & 1-propanol | 83 |

| Components | Boiling Point °C. |
|---|---|
| PDMC & azeotrope | 79 |

Various amounts of water, up to 50 percent by volume, were added incrementally to the azeotropic mixture of 80 percent by weight of PDMC and 20 percent by weight of 1-propanol (72:28%) to determine the usefulness of the mixture as a drying solution. No change in the component ratio was observed in the vapor phase, indicating a true ternary azeotrope.

EXAMPLE 2

A mixture was prepared of one part of perfluoro-1,4-dimethylcyclohexane, 50 parts of 1-propanol and 5 parts of water heated to boiling.

A batch of thyristors was dried in the above mixture by immersing in the hot solution for about 30 seconds and allowing to dry in the vapor above the solution.

Ninety percent of the thyristors reached 1000 volts forward blocking, indicating proper drying of the devices, whereas only 70 percent of devices dried in acetone obtained this level.

Seventy-two percent of the thyristor devices dried according to the invention had a breakdown of more than 600 volts, whereas only 58 percent of acetone dried devices achieved this level.

The electrical properties of the thyristors were not adversely affected by the drying mixture.

EXAMPLE 3

A batch of thyristors was dried in a hot mixture made by mixing 50 parts of 1-propanol, 5 parts of water and one part of perfluoro-2-butyltetrahydrofuran.

The electrical properties of the devices were not adversely affected by the drying agent.

I claim:

1. An azeotropic mixture of 1-propanol, water and a perfluoro compound selected from the group consisting of perfluoro-2-butyltetrahydrofuran and perfluoro-1,4-dimethylcyclohexane.

2. A mixture according to claim 1 wherein the compound is perfluoro-2-butyltetrahydrofuran.

3. A mixture according to claim 1 wherein the compound is perfluoro-1,4-dimethylcyclohexane.

4. A method of drying silicon wafers which comprises rinsing said devices with water, immersing in a hot azeotropic mixture of 1-propanol, water and a perfluoro compound selected from the group consisting of perfluoro-2-butyltetrahydrofuran and perfluoro-1,4-dimethylcyclohexane and draining.

* * * * *